(12) United States Patent
Jeong et al.

(10) Patent No.: US 8,586,477 B2
(45) Date of Patent: Nov. 19, 2013

(54) SEMICONDUCTOR APPARATUS, METHOD OF MANUFACTURING THE SAME, AND METHOD OF MANUFACTURING SEMICONDUCTOR PACKAGE

(75) Inventors: Se-young Jeong, Suwon-si (KR); Ho-jin Lee, Seoul (KR); Ho-geon Song, Suwon-si (KR); Jae-hyun Phee, Incheon (KR)

(73) Assignee: Samsung Electronics Co., Ltd., Samsung-ro, Yeongton-gu, Suwon-si, Gyeonggi-do (KR)

( * ) Notice: Subject to any disclaimer, the term of this patent is extended or adjusted under 35 U.S.C. 154(b) by 163 days.

(21) Appl. No.: 13/195,128

(22) Filed: Aug. 1, 2011

(65) Prior Publication Data

US 2012/0028412 A1    Feb. 2, 2012

(30) Foreign Application Priority Data

Aug. 2, 2010  (KR) .................. 10-2010-0074662

(51) Int. Cl.
   *H01L 21/44*    (2006.01)
   *H01L 21/00*    (2006.01)
   *H01L 23/04*    (2006.01)

(52) U.S. Cl.
   USPC ..... 438/667; 437/107; 257/698; 257/E23.011

(58) Field of Classification Search
   USPC ............... 438/667, 672, 675, 629; 257/698, 257/E23.067, E21.577, E23.011, E23.145
   See application file for complete search history.

(56) References Cited

U.S. PATENT DOCUMENTS

| 2005/0017338 A1* | 1/2005 | Fukazawa | 257/686 |
| 2008/0299768 A1* | 12/2008 | Yamano | 438/667 |
| 2010/0225002 A1* | 9/2010 | Law et al. | 257/774 |

FOREIGN PATENT DOCUMENTS

| JP | 62-230027 | 10/1987 |
| KR | 10-2005-0030260 A | 3/2005 |
| KR | 10-2005-0077861 A | 8/2005 |
| KR | 10-2010-0003492 A | 1/2010 |

\* cited by examiner

*Primary Examiner* — Daniel Luke
*Assistant Examiner* — Khaja Ahmad
(74) *Attorney, Agent, or Firm* — Muir Patent Consulting, PLLC (57) ABSTRACT

A semiconductor apparatus having a through electrode, a semiconductor package, and a method of manufacturing the semiconductor package are provided. The method of includes preparing a substrate including a buried via, the buried via having a first surface at a first end, and the buried via extending from a first substrate surface of the substrate into the substrate; planarizing a second substrate surface of the substrate opposite the first substrate surface to form a through via by exposing a second via surface at a second end of the buried via opposite the first end; forming a conductive capping layer on the exposed second via surface of the through via; and recessing the second substrate surface so that at least a first portion of the through via extends beyond the second substrate surface.

20 Claims, 10 Drawing Sheets

SEMICONDUCTOR APPARATUS, METHOD OF MANUFACTURING THE SAME, AND METHOD OF MANUFACTURING SEMICONDUCTOR PACKAGE

CROSS-REFERENCE TO RELATED APPLICATIONS

This application claims the benefit of priority to Korean Patent Application No. 10-2010-0074662, filed on Aug. 2, 2010, in the Korean Intellectual Property Office, the disclosure of which is incorporated herein in its entirety by reference.

BACKGROUND

The disclosed embodiments relate to a semiconductor apparatus, a method of manufacturing the same, and a method of manufacturing a semiconductor package, and more particularly, to a semiconductor apparatus having a through via, a method of manufacturing the semiconductor apparatus, and a method of manufacturing a semiconductor package using the semiconductor apparatus having a through via.

Recently, semiconductor devices and semiconductor packages are becoming miniaturized and light in weight according to the trend of miniaturizing electronic products and making electronic products lightweight. Performance improvement of a semiconductor chip may be limited, however, based on the increased length of wires associated with stacking semiconductor chips to form a stacked package, which could cause an undesirable signal delay among other effects. As a solution of this problem, a stacking technique of semiconductor layers using a through-substrate via (TSV) method is widely used. The TSV method is a method of transmitting signals and power between semiconductor chips by connecting upper and lower sides of a substrate, such as a silicon substrate, when the semiconductor chips are stacked after forming a hole that passes through the substrate. When the TSV technique is applied, a 3D package in which semiconductor chips are electrically connected by three-dimensionally stacking the semiconductor chips can be realized, and also, a high performance system-in package (SIP) is expected to be realized.

SUMMARY

The disclosed embodiments provide a semiconductor apparatus having a through via that has improved uniformity, and a method of manufacturing the semiconductor apparatus.

The disclosed embodiments also provide a method of manufacturing a semiconductor package having a through via that has improved connection performance.

According to one embodiment, a method of manufacturing a semiconductor device is disclosed. The method of includes preparing a substrate including a buried via, the buried via having a first surface at a first end, and the buried via extending from a first substrate surface of the substrate into the substrate; planarizing a second substrate surface of the substrate opposite the first substrate surface to form a through via by exposing a second via surface at a second end of the buried via opposite the first end; forming a conductive capping layer on the exposed second via surface of the through via; and recessing the second substrate surface so that at least a first portion of the through via extends beyond the second substrate surface.

According to another embodiment, a method of manufacturing a semiconductor device is disclosed. The method includes providing a first semiconductor substrate including a first substrate surface and a second substrate surface opposite the first substrate surface; forming a first electrode in the first semiconductor substrate, the first electrode having one electrode end surface on the same plane as the first substrate surface, and the first electrode extending into the semiconductor substrate without passing entirely through the semiconductor substrate; planarizing the second substrate surface to expose a bottom end surface of the first electrode outside the semiconductor substrate, thereby forming a first through electrode extending from the first substrate surface to the planarized second substrate surface; forming a conductive capping layer on the bottom end surface of the first through electrode; and recessing the second planarized substrate surface so that a first portion of the first through electrode extends beyond the planarized second substrate surface after recessing.

According to another embodiment, a method of manufacturing a semiconductor package is disclosed. The method includes preparing a plurality of substrates. For each substrate, the method includes preparing the substrate to include a plurality of buried electrodes, each buried electrode having a first surface at a first end and extending from a first substrate surface of the substrate into the substrate, planarizing a second substrate surface of the substrate opposite the first substrate surface to form a plurality of through electrodes by exposing a second electrode surface at a second end of each buried electrode opposite the first end, forming a conductive capping layer on the exposed second electrode surface of each of the plurality of through electrodes, and recessing the second substrate surface so that at least a first portion of each of the plurality of through electrodes extends beyond the second substrate surface. The method further includes for each of the plurality of through electrodes for each substrate, forming a first conductive bump on a lower part of the conductive capping layer, thereby forming a plurality of first conductive bumps for each substrate; and stacking the plurality of substrates.

BRIEF DESCRIPTION OF THE DRAWINGS

Exemplary embodiments will be more clearly understood from the following detailed description taken in conjunction with the accompanying drawings in which.

DETAILED DESCRIPTION OF THE EMBODIMENTS

The disclosed embodiments will now be described more fully with reference to the accompanying drawings.

The invention may, however, be embodied in many different forms and should not be construed as being limited to the embodiments set forth herein.

It will be understood that when an element or layer is referred to as being "on" or "covering" another element or layer, the element or layer may be directly on or contacting another element or layer, or intervening elements or layers may be disposed therebetween. In the drawings, the thickness of each of layers or sizes may be exaggerated for clarity. Like reference numerals in the drawings denote like elements.

It will be understood that, although the terms first, second, third, etc., may be used herein to describe various elements, components, regions, layers and/or sections, these elements, components, regions, layers and/or sections should not be limited by these terms. Unless otherwise noted, these terms are only used to distinguish one element, component, region, layer or section from another region, layer or section. Thus, a first element, component, region, layer or section discussed below could alternatively be termed a second element, component, region, layer or section without departing from the teachings of the inventive concept.

The embodiments discussed herein are described with reference to cross-sectional illustrations that are schematic illustration of idealized embodiments. As such, variations from the shapes of the illustration as a result, for example, of manufacturing techniques and/or tolerances, are to be expected. Thus, embodiments should not be construed as limited to the particular shapes of the regions illustrated herein but are to include deviations in shapes that result, for example, from manufacturing.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Figure 1:
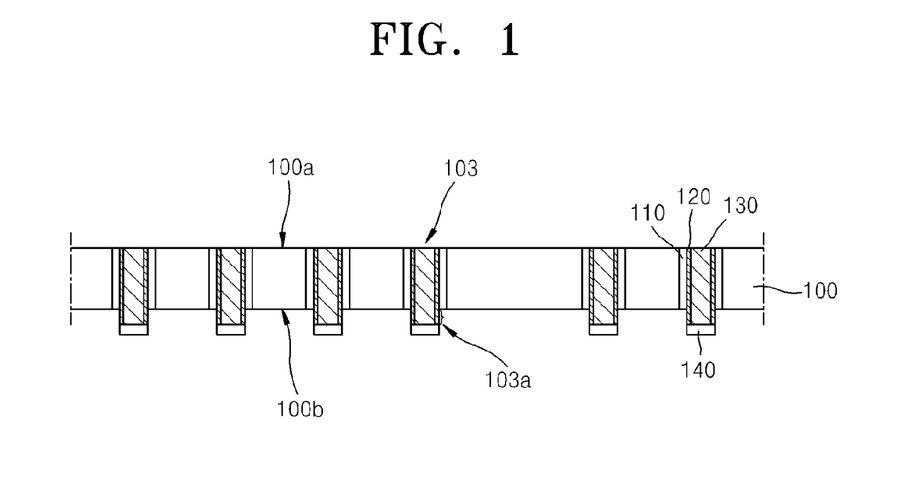
FIG. 1 is a cross-sectional view of a semiconductor apparatus having a through via, according to one exemplary embodiment.

FIG. 1 is a cross-sectional view of a semiconductor apparatus having a through via, according to one exemplary embodiment.

Referring to FIG. 1, in one embodiment, a substrate 100 includes a first surface 100a which is an active surface on which a semiconductor device is formed and a second surface 100b opposite the first surface 100a. For example, the active surface may include circuitry that implements a semiconductor chip, such as a memory chip or microprocessor chip. The substrate 100 may include one or more through vias 103 that is a connection path for connecting the functions of the semiconductor chip to the outside, wherein the through vias 103 may be formed in a predetermined shape between the first surface 100a and the second surface 100b. The through vias 103 are formed through respective openings in the substrate 100, and in one embodiment, extend from the first surface 100a to the second surface 100b. The through vias 103 may include one or more layers, such as layers 110, 120, and 130 discussed further below. The term "through via" as used herein refers to a structure that extends through a substrate, from one surface of the substrate to an opposite surface of the substrate. A through via may extend past one or both of the surfaces of the substrate. In addition, the term "via" may refer to one or more of the elements that form a structure that passes through the substrate (e.g., one or more of elements 110, 120, or 130 shown in FIG. 1). In one embodiment, a predetermined portion, such as portion 103a, of each of the through vias 103 may extend past the second surface of the substrate 100, and may thus protrude from the lower side of the substrate 100.

The through vias 103 may be formed to extend from the first surface 100a to the second surface 100b through back grinding the second surface 100b of the substrate 100 after forming a buried via in the substrate 100, as discussed further below. In one embodiment, the through vias 103 may perpendicularly pass through a semiconductor chip, and may be formed to be physically and electrically connected between the semiconductor chips of a stacked chip package or between a semiconductor chip and a package substrate. A method of manufacturing a substrate including the through vias 103 will be described in detail with reference to FIGS. 2 through 9.

In one embodiment, the through vias 103 may include an insulating layer 110, a diffusion preventive layer 120, and a conductive layer 130 that forms a through electrode, and may be capped with a capping layer 140. The insulating layer 110 may be formed adjacent to and contacting a sidewall of an opening in the substrate 100, and functions to insulate the substrate 100 from the remaining portions of the through via 103. In one embodiment, the insulating layer 110 may be formed to completely surround a portion of the sidewalls of the diffusion preventive layer 120 and the conductive layer 130 (i.e. to surround the circumference of those layers at an end portion of those layers). The insulating layer 110 may be formed, for example, of at least one material selected from the group consisting of a silicon oxide, a polyimide, a silicon nitride, a silicon metal oxide, a photosensitive insulating material, and a polymer.

The diffusion preventive layer 120 may be formed on a sidewall of an opening in the substrate 100. In one embodiment, diffusion preventive layer 120 is formed adjacent to and contacting the insulating layer 110 so that the insulating layer 110 is disposed between the substrate and the diffusion preventive layer 120. The diffusion preventive layer 120 may be formed of at least one material selected from the group consisting of titanium, titanium nitride, tantalum, tantalum nitride, and ruthenium.

Conductive layer 130, which may transmit electrical signals and may be referred to as a through electrode, may be located in a center of the through via 103, and in one embodiment, may be surrounded by and in contact with the diffusion preventive layer 120. The conductive layer 130 may be formed of one selected from the group consisting of Au, Ag, Cu, Al, Ni, Cr, and W. In a situation where the diffusion preventive layer 120 is made of an electrically conductive material, the combined conductive layer 130 and diffusion preventive layer 120 may together comprise an electrode.

In one embodiment, capping layer 140 is formed on a lower surface of the through via 103. The capping layer 140 may have a predetermined thickness and may be formed on the lower end surface of the through via 103 by using an electro-less-plating method. The capping layer 140 may be formed of at least one selected from the group consisting of Al, Au, Be, Bi, Co, Hf, In, Mn, Mo, Ni, Pb, Pd, Pt, Rh, Re, Ru, Ta, Te, Ti, W, Zn, Zr, a nitride of these materials, and a silicide of these materials.

The substrate 100 may be formed of a semiconductor material, for example, one selected from the group consisting of a group IV semiconductor, a group III-V semiconductor compound, and a group II-VI semiconductor oxide. For example, the Group IV semiconductor may be one of Si, Ge, and SiGe. The substrate 100 may be provided in a bulk wafer or an epitaxial layer. Also, the substrate 100 may be a silicon-on-insulator (SOI) substrate. The substrate 100 may comprise at least one semiconductor chip. For example, the substrate 100 may be a wafer that includes a plurality of semiconductor chips arranged adjacent to each other, and can be separated in a dicing process. The substrate 100 may include an active surface that includes various doped regions that form transistors and other circuit elements, and may also include additional semiconductor device layers (e.g., insulating layers, adhesive layers, etc., not shown) disposed on the active surface and having a predetermined height.

The semiconductor chip and/or a package including a stack of semiconductor chips may be referred to as a semiconductor device. The semiconductor device may be a memory device such as a dynamic random access memory (DRAM), a static random access memory (SRAM), a phase-change memory random access memory (PRAM), or a flash memory, or may be a non-memory device such as a logic device. More specifically, the semiconductor device may include transistors, resistors, and wires, and may include conductive pads (not shown) exposed to the outside so that the semiconductor device can be electrically connected to the outside. Also, elements, such as a passivation layer for protecting the package or the semiconductor device, may further be included on the substrate 100.

FIGS. 2 through 9 are cross-sectional views illustrating a method of manufacturing a semiconductor apparatus having a through electrode, according to certain exemplary embodiments.

Figure 2:
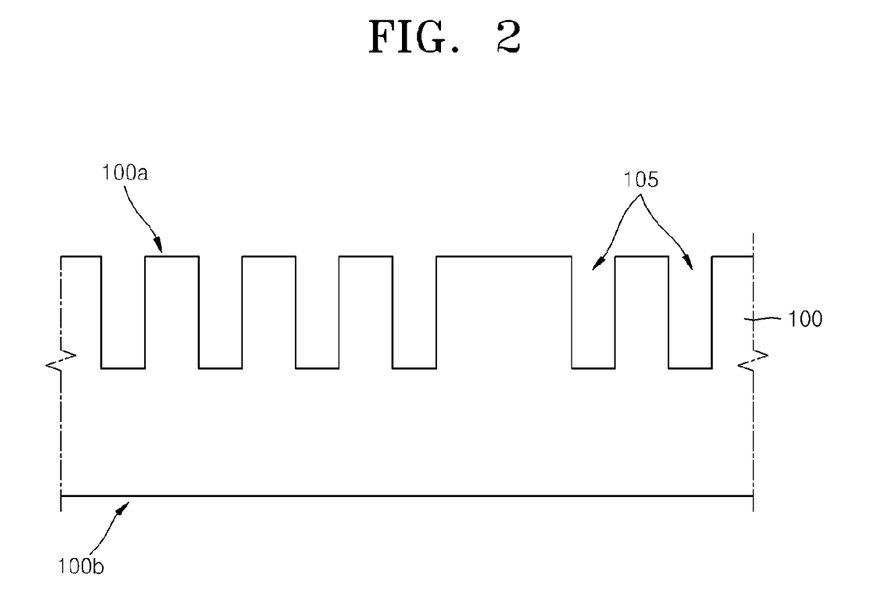
FIGS. 2 through 9 are cross-sectional views illustrating a method of manufacturing a semiconductor apparatus having a through via, according to certain exemplary embodiments.

Referring to FIG. 2, at least one vertical hole 105 is formed in substrate 100. The vertical hole 105 may extend from the first surface 100a toward the second surface 100b, but in one embodiment, does not extend all the way to the second surface 100b but terminates within the substrate 100. The vertical hole 105 refers to a hole for forming a through electrode and through via and may be formed, for example, using a deep reactive ion etching (DRIE) method. An etching process may be performed after forming a photoresist patterns (not shown) on the substrate 100. Alternatively, the vertical hole 105 may be formed using a laser processing method or a chemical etching method. In one embodiment, the vertical hole 105 may have a depth of a few to a few tens of μm, for example, in a range from about 30 to about 80 μm. The vertical hole 105 may have a diameter of a few to a few tens of μm, for example, in a range from about 5 to about 10 μm.

The method of forming the through via described herein may occur at different times, according to different embodiments. For example, in one embodiment, the formation of the through via is performed before a front-end of line (FEOL), which is a process for forming a substrate. In another embodiment, the formation of the through electrode is performed after the completion of a process of forming elements (e.g., transistors, resistors, capacitors, etc.) on a substrate. However, the method of manufacturing a semiconductor apparatus having the through via, according to the present disclosure, is not limited to one of the above methods.

Figure 3:
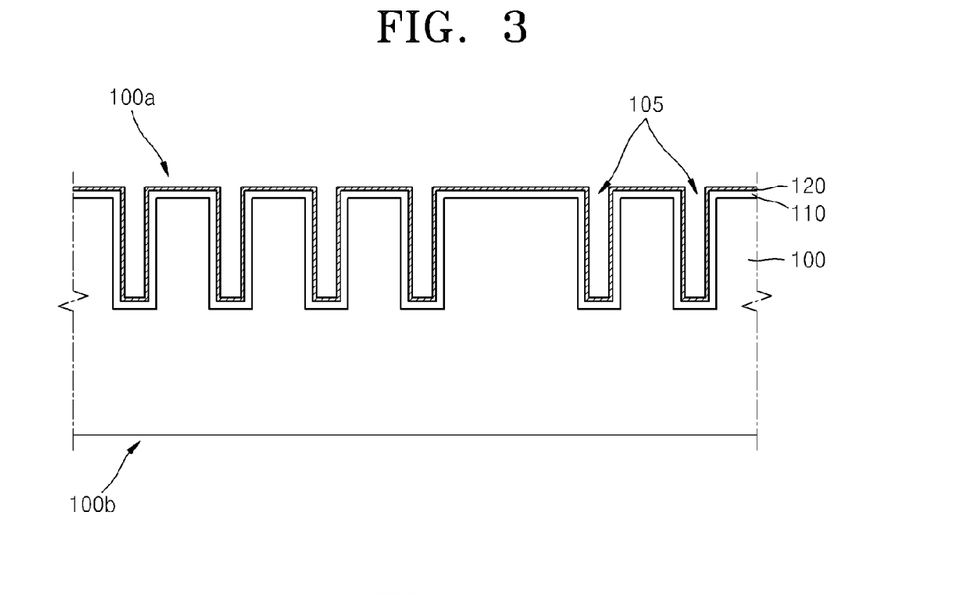

Referring to FIG. 3, after the formation of the holes 105, an insulating layer 110 may be conformally formed on the first surface 100a of the substrate 100 to contact and cover the first surface 100a, including sidewalls and bottom surfaces of the holes 105. Subsequently, a diffusion preventive layer 120 may be conformally formed on the first surface 100a of the substrate 100 to cover both the insulating layer 110 and the first surface 100a. In one embodiment, the diffusion preventive layer 120 contacts the insulating layer 110.

When the substrate 100 is a conductive substrate 100 and needs to be electrically insulated from a through electrode, the insulating layer 110 functions to electrically insulate the substrate 100 from the through electrode which is formed in a subsequent process. In one embodiment, the insulating layer 110 may be formed of one selected from the group consisting of a silicon oxide film, a polyimide film, a silicon nitride film, a silicon metal oxide, a photosensitive insulating film, and a polymer film. If the substrate 100 is a silicon wafer, the insulating layer 110 may be formed using an oxidation process or a nitration process. The insulating layer 110 may be formed at a low temperature, for example, at a temperature below 400° C. by using a plasma-enhanced chemical vapor deposition (PECVD) method.

In one embodiment, the insulating layer 110 insulates the substrate 100 from a through electrode 130 (refer to FIG. 1) after the through electrode 130 is formed. Thus, a voltage applied to the through electrode 130 may not be applied to the substrate 100 during an operation. Also, the insulating layer 110 together with the diffusion preventive layer 120 block a material of the through electrode 130 from penetrating into the substrate 100. The insulating layer 110 may also conduct heat, and may thus transfer heat generated from the through electrode 130 to the substrate 100 and reduce the degradation or an electro-migration phenomenon of the through electrode 130.

In one embodiment, the diffusion preventive layer 120 may be formed of at least one selected from the group consisting of Ti, TiN, Ta, TaN, and Ru. The diffusion preventive layer 120 may be a single layer or a composite layer, for example, a Ti/TiN layer or a Ta/TaN layer, and may be formed using a chemical vapor deposition (CVD) method.

The diffusion preventive layer 120 may prevent a material of the through electrode 130 (refer to FIG. 1), which will be formed in a subsequent process, from penetrating into the substrate 100. For example, when the through electrode 130 is formed of copper, the diffusion preventive layer 120 may prevent copper from penetrating into the substrate 100. Also, the diffusion preventive layer 120 may increase the reliability of a semiconductor chip by preventing the through electrode 130 from causing cracks due to the heat generated during the operation of the semiconductor device.

In one embodiment, in a deposition process of a conductive layer, which will be described below with reference to FIG. 4, an electroplating method is used as the deposition method, and a seed layer (not shown) for transmitting a current for electroplating may be additionally stacked on the diffusion preventive layer 120.

Figure 4:
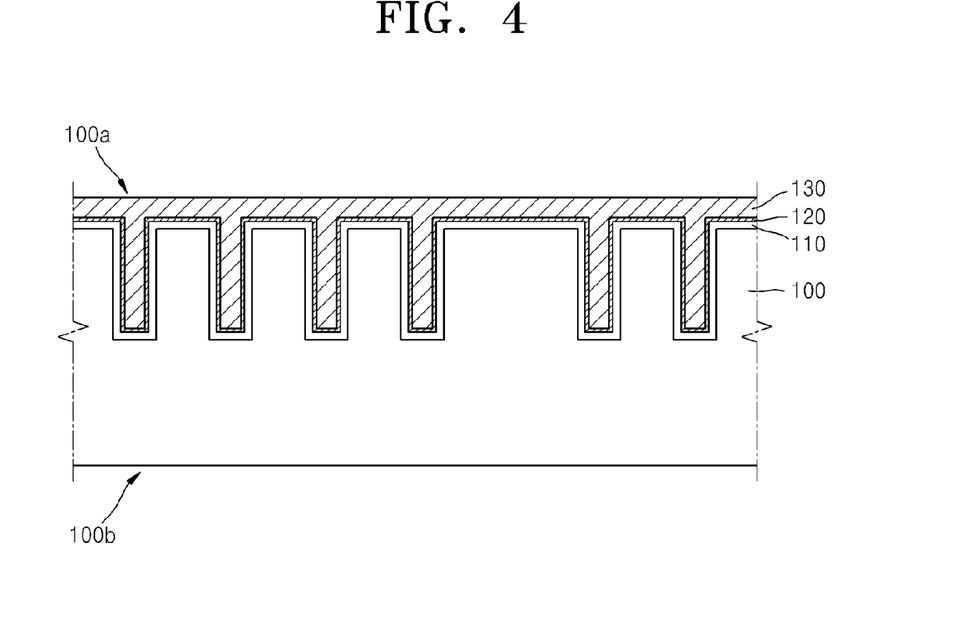

Referring to FIG. 4, a conductive layer 130 is formed by depositing a conductive material on the stack structure of the insulating layer 110 and the diffusion preventive layer 120 formed on the substrate 100. In one embodiment, the conductive layer 130 may be formed of one selected from the group consisting of Au, Ag, Cu, Al, Ni, Cr, and W. The conductive layer 130 may be a single layer or a composite layer or may be formed of an alloy of at least two metals. For example, in the case where the through via is formed before a FEOL, the conductive layer 130 may be formed of a polysilicon deposited by a CVD method, and, in the case where the through via is formed after forming elements on the substrate, the conductive layer 130 may be formed of copper deposited by using an electroplating method.

The conductive layer 130 may be formed, for example, using an electroplating method, a vacuum evaporation method, a sputtering method, a CVD method, or a sintering method after burying a conductive paste. When an electroplating method is used as the deposition method, the diffusion preventive layer 120 may function as a seed layer for transmitting a current for electroplating. Alternatively, the conductive layer 130 may be deposited by using a seed layer (not shown) additionally stacked on the diffusion preventive layer 120.

Figure 5:
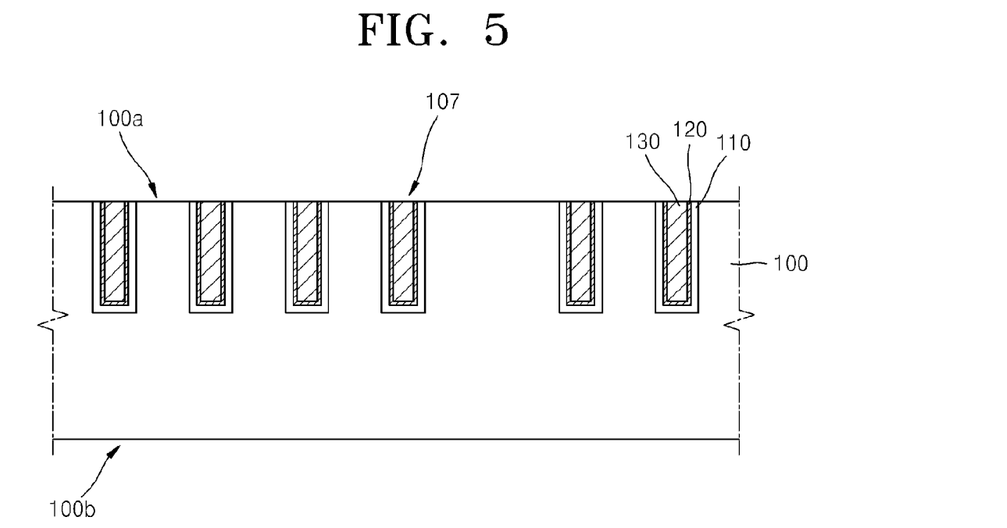

Referring to FIG. 5, a planarization process may be performed on the first surface 100a of the substrate 100. Through the planarization process, deposition materials of the insulating layer 110, the diffusion preventive layer 120, and the conductive layer 130 that are on the first surface 100a of the substrate 100 may be removed. In one embodiment, the planarization process may use a chemical mechanical polishing (CMP) method. Through the planarization process, a via that has a first surface (i.e., an upper surface) coplanar with the first surface 100a of the substrate 100 and that extends into the substrate 100 is formed. The via is referred to herein as a buried via 107, as the via does not pass entirely through the substrate but remains buried in the substrate. Similarly, the portion of the via that comprises an electrode (i.e., conductive layer 130) that has a first surface coplanar with the first surface 100a of the substrate 100 and that extends into the substrate is referred to as a buried electrode. The buried via 107 and buried electrode may have a cylindrical column shape, or may have other shapes.

Figure 6:
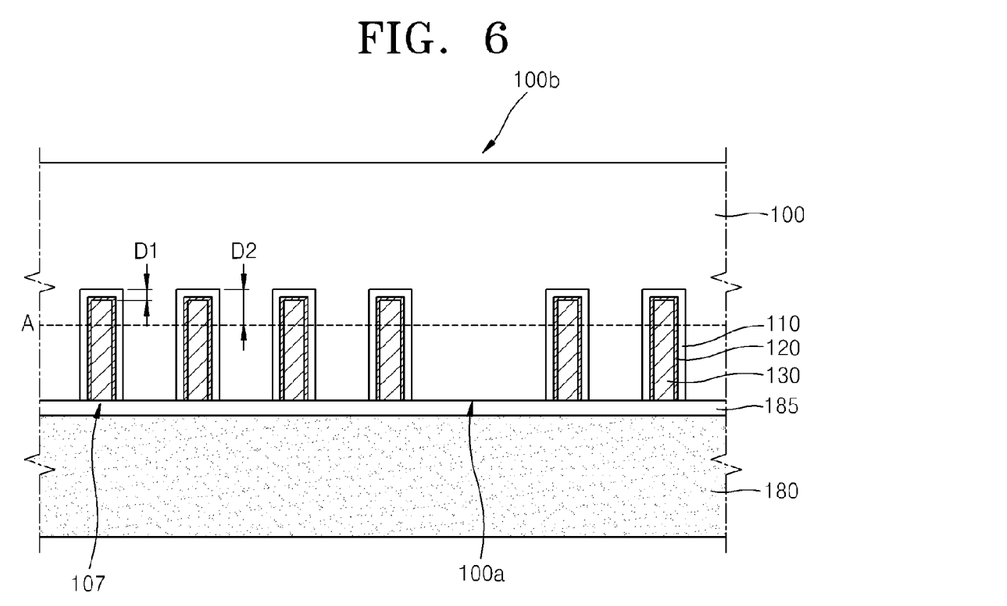

FIG. 6 shows an step of turning the substrate 100 upside down after attaching a carrier substrate 180 on the first surface 100a (i.e., an upper surface) of the substrate 100.

In one embodiment, the substrate 100 in which the buried via 107 is formed may have a thickness of a few hundreds of μm, for example, in a range from about 700 to about 800 μm. The buried via 107 may have a length of a few tens of μm, for example, in a range from about 30 to about 80 μm. In a subsequent process of manufacturing a semiconductor package, if the substrate 100 is thick, the miniaturization of the semiconductor package may be difficult due to the thickness of the substrate 100, and thus, a process of removing a lower portion of the substrate 100 that is not needed for the semiconductor device may occur. This process is referred to as a thinning of the substrate 100. When the thinning process is completed, the thickness of the substrate 100 may be a few tens of μm or less. Therefore, a supporting unit, such as a wafer support system (WSS), may be used to handle the thin substrate 100. A carrier substrate may perform this function.

Referring to FIG. 6, in one embodiment, a carrier substrate 180 is attached to the first surface 100a of the substrate 100 by an adhesive layer 185, and then, the substrate 100 is overturned so that the first surface 100a (which is still referred to as an upper surface) is oriented to face downward, and the second surface 100b is oriented to face upward. The carrier substrate 180 may function as a WSS, and in one embodiment, may comprise a glass used as a glass water support system (GWSS). The adhesive layer 185 may be a material for attaching and detaching the carrier substrate 180 to and from the substrate 100, and may be a film type or a liquid type.

Figure 7:
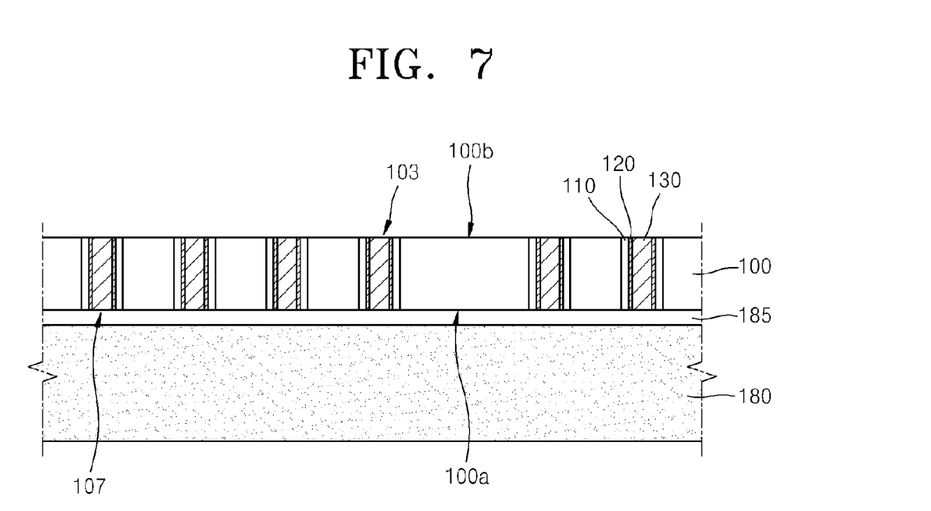

FIG. 7 shows an operation of backside thinning and washing of the substrate 100, according to one exemplary embodiment. Referring both to FIGS. 6 and 7, a backside thinning process may be performed on the second surface 100b until the height of the second surface 100b is reduced to a height corresponding to a dotted line A in FIG. 6. In one embodiment, the backside thinning process may be performed on the second surface 100b using one or more selected from the group comprising of a grinding method, a CMP method, a dry etching method, and a wet etching method. For example, a CMP may be additionally performed after grinding, or etching may be additionally performed after grinding.

The backside thinning process performed on the second surface 100b may further be performed after the buried via 107 is exposed at the second surface 100b of the substrate 100. That is, after the buried via 107 is exposed, the buried via 107 may be ground together with the second surface 100b of the substrate 100. In one embodiment, the height D2 of the buried via 107 removed by the backside thinning process may be greater than the sum of thicknesses D1 of the insulating layer 110 and the diffusion preventive layer 120 stacked on a lower side of the buried electrode 107, so that an end surface of the electrode 130 is exposed outside the substrate. Through the backside thinning process, the substrate 100 may become a thin substrate 100, for example, a thin wafer. The buried via 107 and the buried electrode become a through via 103 and through electrode that passes through the substrate 100 from the first surface 100a to the second surface 100b of the substrate 100 as a result of the backside thinning process.

In a process of forming the through via 103 in a conventional through-silicon via, the length of a through-silicon via finally formed may have a predetermined deviation. The deviation may occur as a result of a deviation that occurs when a buried electrode is formed, a deviation of thickness of backside thinning due to the non-uniform thickness of an adhesive layer, and a deviation that occurs by the backside thinning process itself. In the method of manufacturing the through vias 103 according to the disclosed embodiments, however, the deviation of the length of the through vias 103 may be minimized because grinding is performed at both ends of the through vias 103, and because the substrate 100 is further polished so that a portion 103a of the through vias 103, and an additional capping layer 140 extends beyond the surface of the substrate 100, as described further below.

After the backside thinning process is completed, a washing process may be performed to remove impurities that may be present on the second surface 100b of the substrate 100. Through the washing process, the material of the through via 103 may be prevented from contamination. For example, when the through via 103 includes an electrode formed of copper, a surface of copper may be easily scratched during a planarization process and may be easily corroded. Thus, in one embodiment, the washing process may be performed using a washing agent that includes nitric acid, silicon oxide, fluoric acid, or a chelating agent.

Figure 8:
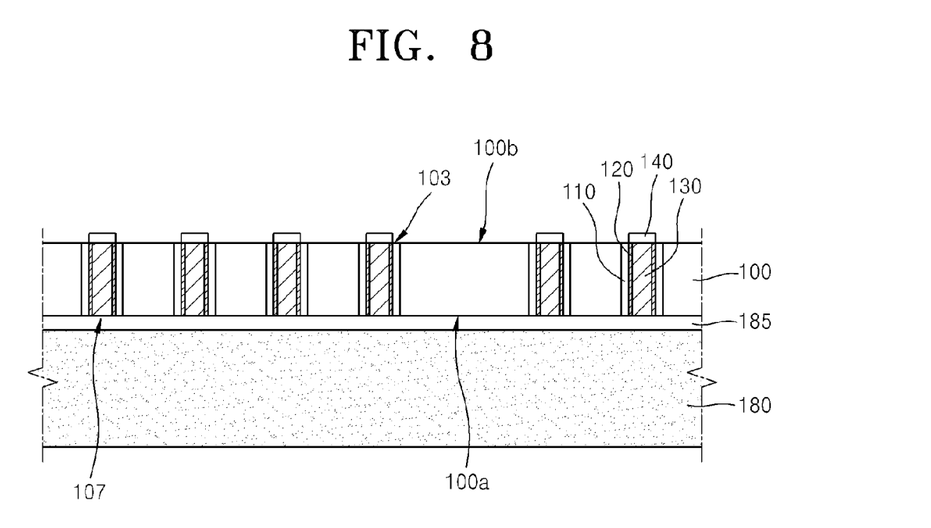

Referring to FIG. 8, in one embodiment, a capping layer 140 is formed on an exposed surface of the through via 103 that is exposed on the second surface 100b. The capping layer 140 may be formed of at least one selected from the group consisting of Al, Au, Be, Bi, Co, Hf, In, Mn, Mo, Ni, Pb, Pd, Pt, Rh, Re, Ru, Ta, Te, Ti, W, Zn, Zr, a nitride of these materials, and a silicide of these materials. The capping layer 140 may be a single layer or a composite layer, and in one embodiment may be formed of a material different from a material used to form the conductive layer 130.

The capping layer 140 may be formed by an electroless-plating process without the need of a conductive seed layer. In an electroless-plating process, the deposition of the capping layer 140 may be induced through a chemical reducing agent in a bath that includes an electrolyte solution. The capping layer 140 formed by the electroless-plating process may have a uniform thickness and low porosity. The electroless-plating process may be, for example, an electroless nickel-electroless palladium-immersion gold (ENEPIG) process in which electroless nickel, electroless palladium, and immersion gold form a three layer structure. Alternatively, the electroless-plating process may be an electroless nickel-immersion gold (ENIG) process in which electroless nickel and immersion gold form a structure, or a direct immersion gold (DIG) process which is a gold substitution plating process. The capping layer 140 may be formed by a deposition such as CVD or physical vapour deposition (PVD) or etching through patterning of a photoresist layer, besides the electroplating process including the electroless-plating process.

As shown in FIG. 8, in one embodiment the capping layer 140 may be deposited on the diffusion preventive layer 120 and the conductive layer 130, and may thus cover and contact the diffusion preventive layer 120 and the conductive layer 130 at the exposed surface of the through via 103. As such, the capping layer does not cover or contact the insulating layer 110. Alternatively, the capping layer 140 may be formed on an extended area wider than and including the exposed surfaces of the diffusion preventive layer 120 and the conductive layer 130. A more detailed description of different embodiments for the capping layer 140 is described below in connection with FIGS. 10A and 10B. The capping layer 140 may have a thickness of a few μm, for example, in a range from 1 to 3 μm.

Figure 9:
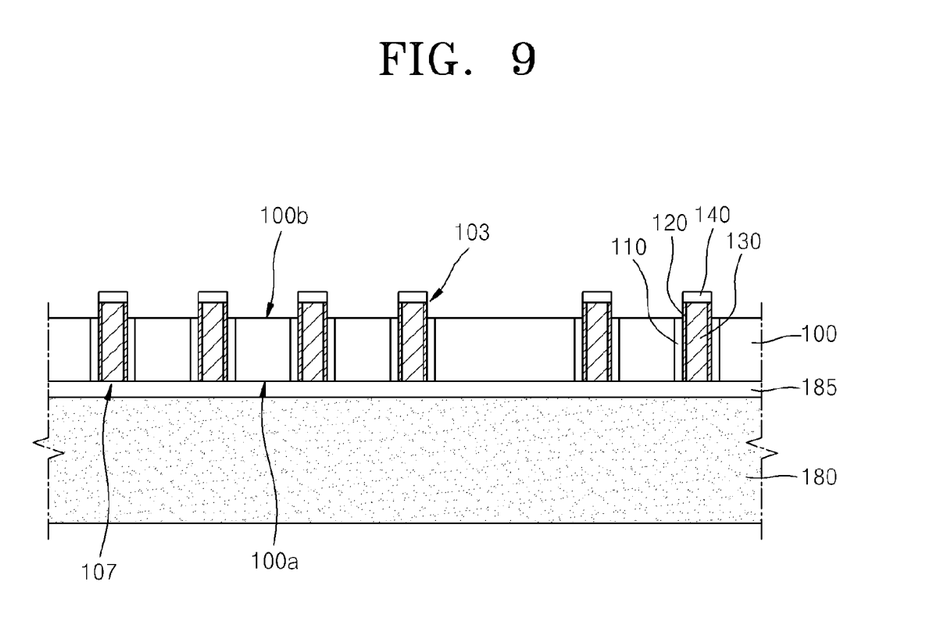

Referring to FIG. 9, the substrate 100 may be recessed so that a portion of the through via 103 is extend beyond the second surface 100b of the substrate 100. In one embodiment, for example, a part of the through via including the conductive layer 130 and the diffusion preventive layer 120 protrude past the second surface 100b such that a sidewall of the diffusion preventive layer 120 is exposed outside the substrate 100. The substrate 100 may be recessed by using, for example, a reactive ion etch (RIE) method, a dry etching method, or a wet etching method. In one embodiment, the insulating layer 110 is etched along with the substrate 100. In one embodiment, the height of the through via 103 protruding past the second surface 100b may be a few μm. When a plurality of substrates 100 are stacked in a subsequent process, by using the recessed substrate 100, the bonding of the substrate 100 connecting to a through via 103 of a next substrate may be made easier.

In one exemplary method of manufacturing the through electrode 103, the substrate 100 is recessed after the capping layer 140 is formed. Accordingly, the material of the conductive layer 130 is not exposed to an etchant during the recessing process. Therefore, a surface contamination, that is, a compound of the conductive layer 130 and the etchant may not form on a surface of the through via 103. Also, the contamination of equipment due to the material of the conductive layer 130 may be prevented. For example, if the conductive layer 130 is formed of copper, the contamination of etching equipment with copper may be prevented during the recessing of the substrate 100.

Next, the carrier substrate 180 is detached from the substrate 100 by removing the adhesive layer 185. The adhesive layer 185 may be irradiated with ultraviolet (UV) light or heated to be removed. If necessary, the carrier substrate 180 may be detached after bonding with another substrate (not shown). After the carrier substrate 180 is finally detached, the semiconductor apparatus of FIG. 1 may be formed after overturning the substrate 100.

Figure 10A:
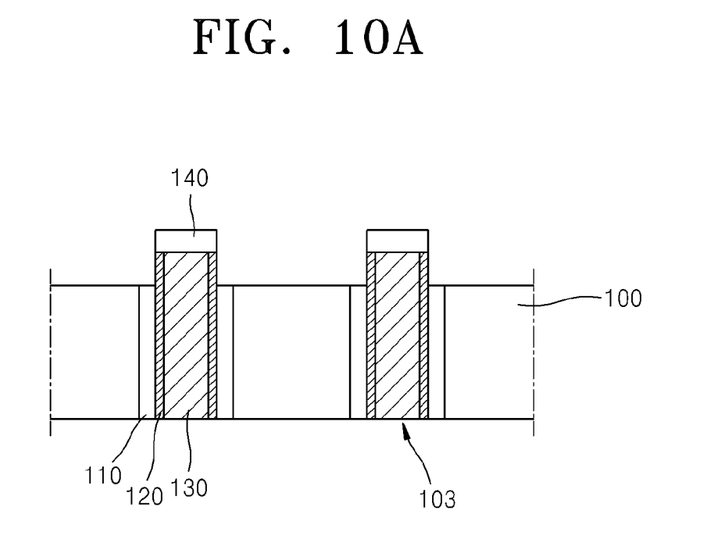
FIGS. 10A and 10B are cross-sectional views showing structures of a capping layer according to one exemplary embodiment.
Figure 10B:
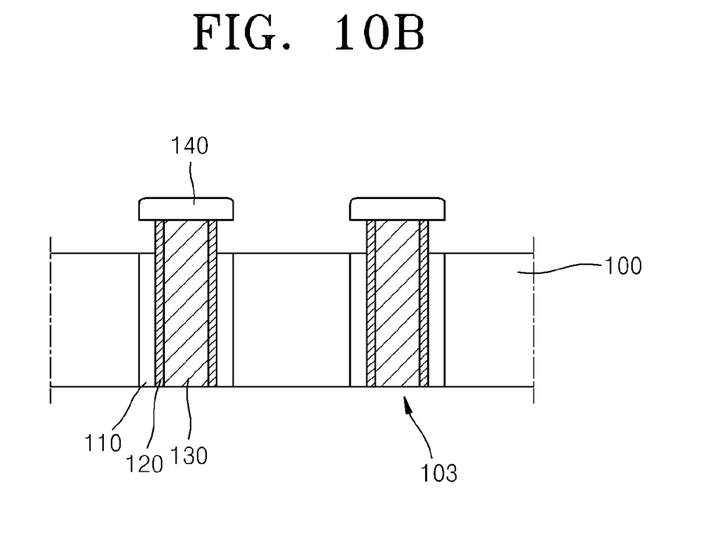

FIGS. 10A and 10B are cross-sectional views showing structures of the capping layer 140 according to exemplary embodiments.

Referring to FIG. 10A, the capping layer 140 may be formed on exposed upper surfaces of the diffusion preventive layer 120 and the conductive layer 130. The capping layer 140 may be formed such that, for example, when the capping layer 140 is formed using an electroless-plating process, the electroless-plating is not performed on the diffusion preventive layer 120 but performed on the conductive layer 130; however, while a plating layer is formed on the conductive layer 130, a plating material of the plating layer having a predetermined distribution range may be extended on the diffusion preventive layer 120.

Referring to FIG. 10B, the capping layer 140 may be formed by extending sides thereof to cover an area including the exposed upper surfaces of the diffusion preventive layer 120 and the conductive layer 130 of the through via 103, and also to cover an additional area to the sides. The capping layer 140 may be formed such that, for example, the capping layer 140 is formed using an electroless-plating process and the electroless-plating is performed on the diffusion preventive layer 120 as well as the insulating layer 130. As such, the capping layer 140 may be formed on regions extended to sides further than the diffusion preventive layer 120 by the distribution of the plating material. After the capping layer 140 is formed, the second surface of the substrate 100 can be further etched to remove additional of the substrate as well as a portion of the insulating layer 110.

Figure 11A:
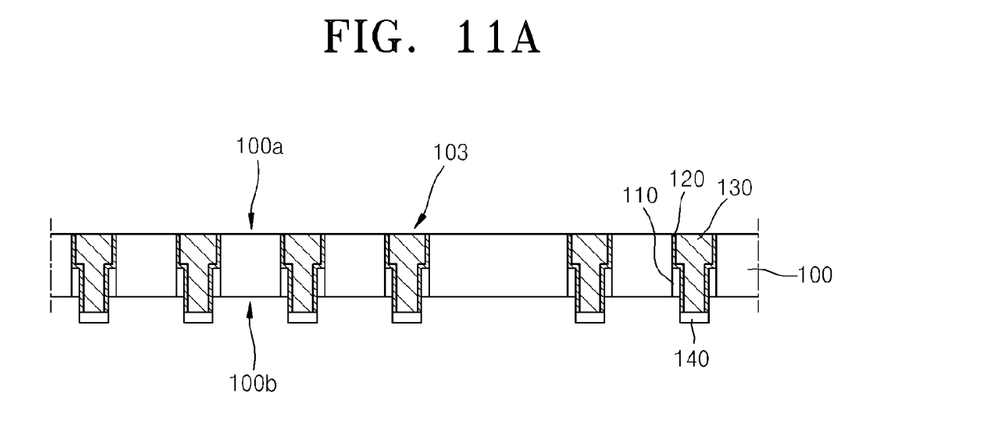
FIGS. 11A and 11B are cross-sectional views showing a semiconductor package having a through via according to another exemplary embodiment.
Figure 11B:
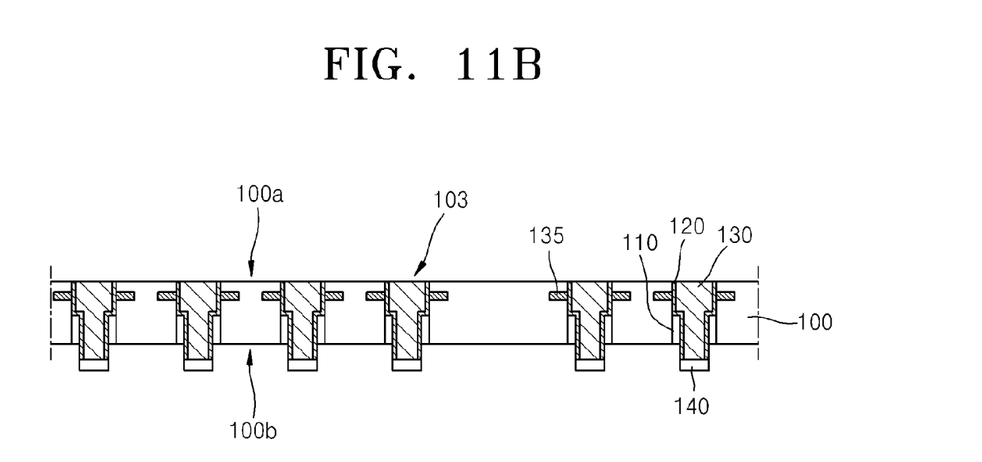

FIGS. 11A and 11B are cross-sectional views showing a semiconductor package having a through via 103 according to other exemplary embodiments. Like reference numerals are used to indicate elements that are similar to and may be formed using the same process and comprised of the same materials as the elements of FIG. 1, and thus the detailed description thereof will not be repeated.

Referring to FIG. 11A, an insulating layer 110 is formed only on a lower part of the through via 103. Such a structure may be formed by stacking a diffusion preventive layer 120 after depositing the insulating layer 110 on the lower part of the through via 103 in the stacking process of the insulating layer 110 described with reference to FIG. 3. The structure may be used when a predetermined portion of the substrate 100 needs to be electrically connected to the through via 103.

FIG. 11B shows a structure in which an upper portion of the through via 103 on which the insulating layer 110 is not formed is connected to the substrate 100 by a conductive pad 135. The conductive pad 135 electrically connects the substrate 100 to the through via 103. The conductive pad 135 may be an element that electrically connects semiconductor device elements, such as transistors, resistors, and the like (not shown) included in the substrate 100 to an external circuit. The conductive pad 135 may be on a layer of the substrate 100 that includes semiconductor chip circuit elements, and may be formed in a process of forming the substrate 100.

FIGS. 12 through 15 are cross-sectional views illustrating a method of manufacturing a semiconductor package, according to certain exemplary embodiments.

Figure 12:
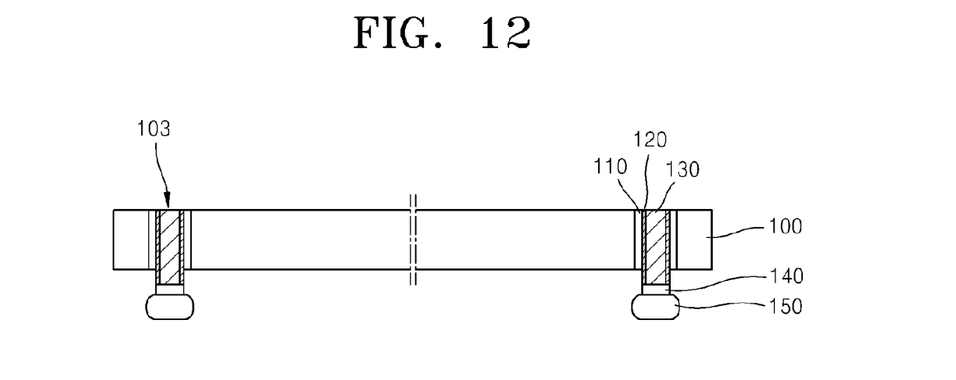
FIGS. 12 through 15 are cross-sectional views illustrating a method of manufacturing a semiconductor package, according to one exemplary embodiment.

Referring to FIG. 12, one or more first conductive bumps 150 may be formed on a lower part of respective capping layers 140. Each first conductive bump 150 may be a connection terminal for bonding to another substrate or a semiconductor chip, and may facilitate electrical connection between elements. In order to manufacture the semiconductor package having the through via 103 according to one embodiment, a process of packaging a first substrate 100 in which the through via 103 is formed may be performed by forming a plurality of semiconductor chips in a wafer, each chip including through vias 103, separating each of the semiconductor chips through a dicing process, and then stacking the separated chips on each other. Alternatively, to manufacture a wafer level package (WLP), a dicing process may be performed by stacking wafers that include a plurality of chips on each other, bonding substrates of the wafers using the through vias 103, and then separating the stacked wafers into individual packages each including a stack of chips.

The first conductive bumps 150 may be formed of at least one of metals selected from the group consisting of Cu, Al, Ni, Ag, Au, Pt, Sn, Pb, Ti, Cr, Pd, In, Zn, and C, a metal alloy, a conductive metal oxide, a conductive polymer material, or a conductive composite material. In one embodiment, the first conductive bumps 150 may have a diameter of a few tens of μm to a few hundreds of μm, for example, in a range from 10 to 30 μm.

When the through via 103 having the capping layer 140 is used, the capping layer 140 may function as a wetting layer between a through via 103 and a first conductive bump 150. Accordingly, a wetting failure, that is, the generation of a gap between a through via 103 and a first conductive bump 150 may be prevented.

Figure 13:
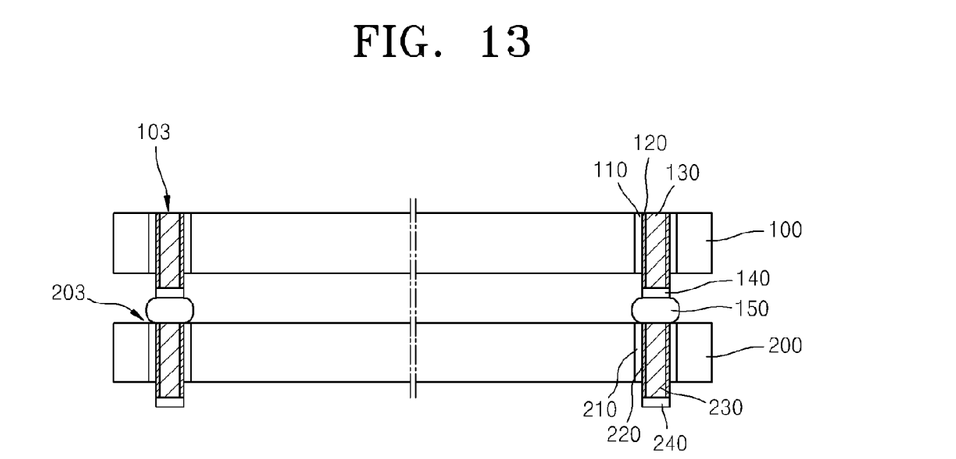

Referring to FIG. 13, a second substrate 200 having one or more through vias 203 is bonded on a lower part of the first substrate 100. The bonding between the first substrate 100 and the second substrate 200 may be achieved by connecting the first conductive bumps 150 of the first substrate 100 to an upper part of the through vias 203 of the second substrate 200. Alternatively, the bonding may be performed such that, after forming an additional conductive pad (not shown) on the through via 203 of the second substrate 200, the conductive pad (not shown) may be connected to the first conductive bump 150 of the first substrate 100.

Figure 14:
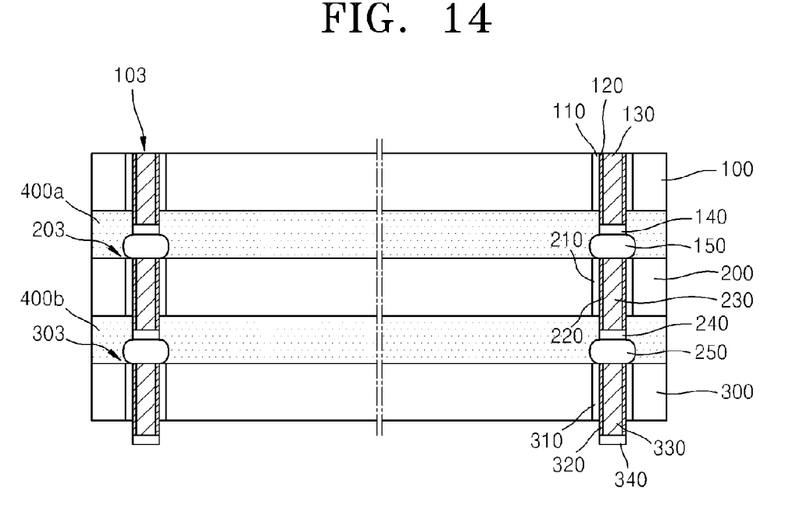

Referring to FIG. 14, a stacking structure is formed by additionally stacking a third substrate 300 on a lower part of the second substrate 200. Underfill layers 400*a* and 400*b* may be formed respectively in gaps between the first substrate 100 and the second substrate 200 and between the second substrate 200 and the third substrate 300. The underfill layers 400*a* and 400*b* may be formed by injecting an underfill material, that is, a liquid phase resin into the gaps and hardening them. Alternatively, the underfill layers 400*a* and 400*b* may be formed using an underfill film such as a non-conductive film (NCF). The underfill film may be formed of a material, for example, an epoxy group material or a silicon group material. Also, the underfill film may include a hardening agent of a phenol type, an acid anhydride type, or an amine type. Also the underfill film may include a heat sensitive material including an acrylic polymer, a thermoplastic material, or a UV hardening material. In one embodiment, the underfill layers contact a first portion of the through electrodes, a capping layer, and the conductive bumps.

Figure 15:
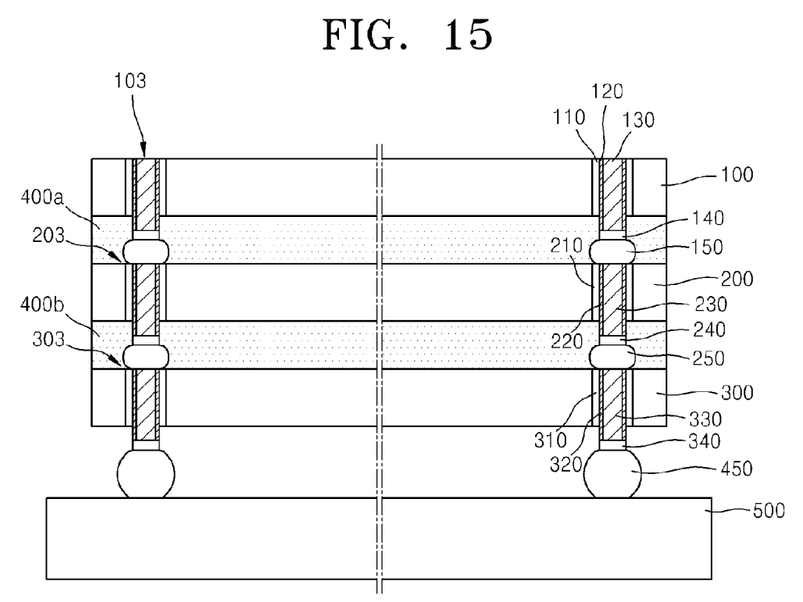

Referring to FIG. 15, the stacked substrates may be bonded onto a package substrate, such as a printed circuit board (PCB) 500. The stacked substrates may be electrically connected to the PCB 500 through one or more second conductive bumps 450 formed on a lower part of the third substrate 300. Alternatively, the structure of stacked substrates may be connected to conductive pads (not shown) of the PCB 500 through conductive wires (not shown) on upper ends of the through vias 103. The PCB 500 may include electronic devices such as semiconductor chips, transistors, diodes, or inductors.

The second conductive bump 450 may be, for example, a solder ball or a solder bump. The second conductive bump 450 may be formed of at least one of metals selected from the group consisting of Cu, Al, Ni, Ag, Au, Pt, Sn, Pb, Ti, Cr, Pd, In, Zn, and C, a metal alloy, a conductive metal oxide, a conductive polymer material, or a conductive composite material. For example, the first conductive bump 150 may be formed of an alloy of Cu—Ni—Pb, Cu—Ni, or Ni—Au. A conductive pad (not shown) may be interposed between the second conductive bump 450 and the PCB 500. In one embodiment, the second conductive bump 450 may have a diameter of a few tens of μm to a few hundreds of μm, for example, in a range from 60 to 100 μm.

In the above description, embodiments in which a wafer level package is applied are described. However, the disclosed embodiments can also be applied to a ball grid array (BGA) package, a flip chip package, a chip scale package, a stack of a semiconductor chip, a wafer stack, and the like.

Figure 16:
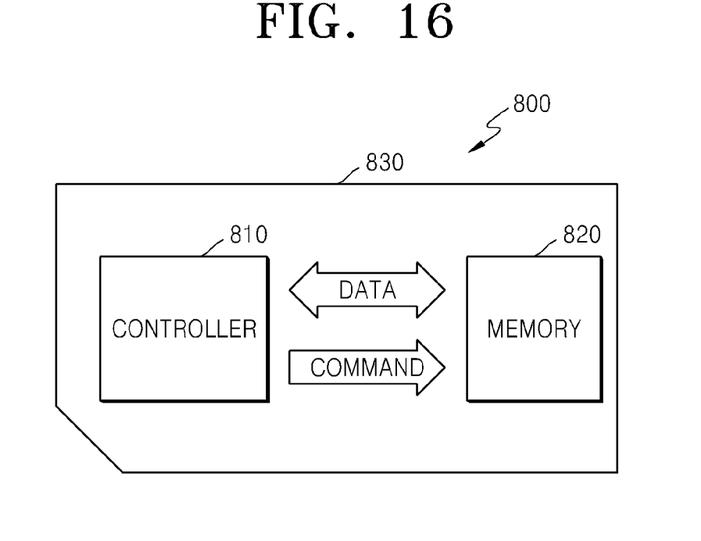
FIG. 16 is a schematic diagram of a memory card having a semiconductor package, according to one exemplary embodiment.

FIG. 16 is a schematic diagram of a memory card 800 having a semiconductor package, according to an exemplary embodiment.

Referring to FIG. 16, the memory card 800 may include a controller 810 and a memory 820 mounted in a housing 830. The controller 810 and the memory 820 may exchange electrical signals. For example, data can be interchanged between the memory 820 and the controller 810 in response to a command of the controller 810. Accordingly, the memory card 800 may store data in the memory 820 or may output data to the outside from the memory 820.

The memory card 800 can be used as a data-storing medium for various devices, such as portable devices. For example, the memory card 800 may include a multi-media card (MMC) or a secure digital card (SD). The memory card 800 may include of one or more substrates such as discussed above in connection with FIGS. 1-15. For example, memory 820 may include a stack of semiconductor memory chips stacked in the manner disclosed in connection with any of FIGS. 1-15, and/or memory card 800 may include a stack of other semiconductor substrates (e.g., logic chips) that are formed and include through vias as discussed above.

Figure 17:
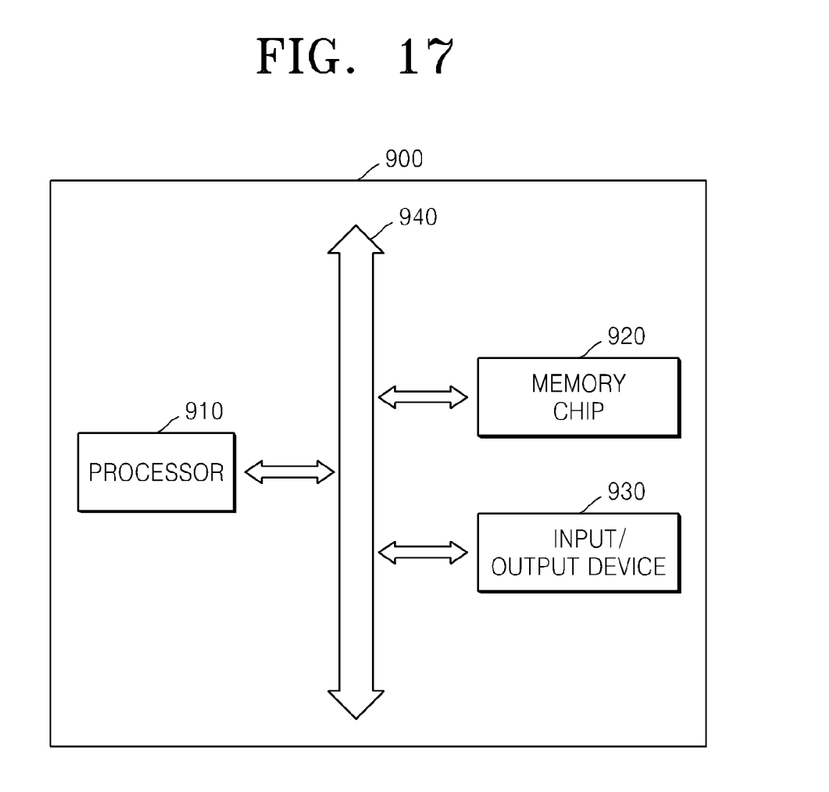
FIG. 17 is a block diagram of an electronic system having a semiconductor package, according to one exemplary embodiment.

FIG. 17 is a block diagram of an electronic system 900 having a semiconductor package, according to one exemplary embodiment.

Referring to FIG. 17, the electronic system 900 may include a processor 910, a memory chip 920, and an input/output device 930. The processor 910, the memory chip 920, and the input/output device 930 may communicate data between each other via a bus 940. The processor 910 may execute a program and may control the electronic system 900. The input/output device 930 may be used for inputting and outputting data. The electronic system 900 may exchange data with an external device, for example, a personal computer or a network via the input/output device 930. The memory chip 920 may store codes and data for operating the processor 910.

The electronic system 900 may constitute various electronic control devices that require the memory chip 920, and may be applied to, for example, desktop or laptop computers, mobile phones, MP3 players, navigation systems, solid state disks (SSD), or household appliances. The electronic system 900 may include one or more substrates such as discussed above in connection with FIGS. 1-15. For example, memory chip 920 may include a stack of semiconductor memory chips stacked in the manner disclosed in connection with any of FIGS. 1-15, and/or electronic system 900 may include a stack of other semiconductor substrates (e.g., logic chips) that are formed and include through vias as discussed above.

While the above disclosure has been particularly shown and described with reference to exemplary embodiments thereof, it will be understood that various changes in form and details may be made therein without departing from the spirit and scope of the following claims.

What is claimed is:

1. A method of manufacturing a semiconductor apparatus, the method comprising:
preparing a substrate including a buried via, the buried via having a first surface at a first end, and the buried via extending from a first substrate surface of the substrate into the substrate;
planarizing a second substrate surface of the substrate opposite the first substrate surface to form a through via by exposing a second via surface at a second end of the buried via opposite the first end;
forming a conductive capping layer on the exposed second via surface of the through via; and
recessing the second substrate surface after forming the conductive capping layer so that at least a first portion of the through via extends beyond the second substrate surface.

2. The method of claim 1, wherein the exposed second via surface includes a conductive material portion.

3. The method of claim 1, further comprising: prior to polishing,
attaching a carrier substrate on the first substrate surface; and
overturning the substrate on which the carrier substrate is attached.

4. The method of claim 1, wherein:
the through via includes a through electrode and a diffusion preventive layer, and
forming the conductive capping layer on the exposed second via surface of the through via includes forming the conductive capping layer to contact and cover the through electrode at the exposed second via surface.

5. The method of claim 4, wherein the forming of the conductive capping layer comprises forming the conductive capping layer to have a greater width than a width of the exposed second via surface.

6. The method of claim 4, wherein the capping layer is formed of a material different from a material used to form the through electrode.

7. The method of claim 4, wherein the through electrode comprises copper.

8. The method of claim 1, wherein the preparing of the substrate comprises:
forming a vertical hole in the first surface of the substrate;
forming the buried via by filling the vertical hole with a conductive material; and
removing conductive materials deposited on the substrate.

9. The method of claim 8, wherein the forming of the buried via comprises sequentially forming an insulating layer and then a diffusion preventive layer in the vertical hole, and forming the conductive layer by filling a central portion of the vertical hole with the conductive material.

10. The method of claim 9, wherein the planarizing comprises exposing the conductive layer by removing the insulating layer and the diffusion preventive layer from the second end of the buried via.

11. A method of manufacturing a semiconductor device, the method comprising:
providing a first semiconductor substrate including a first substrate surface and a second substrate surface opposite the first substrate surface;
forming a first electrode in the first semiconductor substrate, the first electrode having one electrode end surface on the same plane as the first substrate surface, and the first electrode extending into the semiconductor substrate without passing entirely through the semiconductor substrate;
planarizing the second substrate surface to expose a bottom end surface of the first electrode outside the semiconductor substrate, thereby forming a first through electrode extending from the first substrate surface to the planarized second substrate surface;
forming a conductive capping layer on the bottom end surface of the first through electrode; and
after forming the conductive capping layer, recessing the planarized second substrate surface so that a first portion of the first through electrode extends beyond the planarized second substrate surface after recessing.

12. The method of claim 11, wherein forming the first electrode comprises forming a first buried via, the buried via including the first electrode, a diffusion prevention layer, and an insulation layer.

13. The method of claim 11, further comprising:
forming a conductive bump on the conductive capping layer; and
after the step of recessing the planarized second substrate surface, stacking first semiconductor substrate on a second semiconductor substrate,
wherein the conductive bump contacts an exposed surface of a through electrode of the second semiconductor substrate.

14. The method of claim 13, further comprising:
providing an underfill layer between the first semiconductor substrate and the second semiconductor substrate, the underfill layer contacting the first portion of the first through electrode, the capping layer, and the conductive bump.

15. The method of claim 13, further comprising:
stacking the first semiconductor substrate and the second semiconductor substrate on a package substrate to form a stacked chip semiconductor package.

16. The method of claim 11, further comprising:
forming one or more additional through electrodes passing through the first semiconductor substrate, each of the one or more additional through electrodes formed using the same forming, planarizing, forming, and recessing steps as used to form the first through electrode.

17. A method of manufacturing a semiconductor package, the method comprising:
preparing a plurality of substrates, including for each substrate:
preparing the substrate to include a plurality of buried electrodes, each buried electrode having a first surface at a first end and extending from a first substrate surface of the substrate into the substrate,
planarizing a second substrate surface of the substrate opposite the first substrate surface to form a plurality of through electrodes by exposing a second electrode surface at a second end of each buried electrode opposite the first end,
forming a conductive capping layer on the exposed second electrode surface of each of the plurality of through electrodes, and
after forming the conductive capping layer, recessing the second substrate surface so that at least a first portion of each of the plurality of through electrodes below the conductive capping layer extends beyond the recessed second substrate surface;
for each of the plurality of through electrodes for each substrate, forming a first conductive bump on a lower part of the conductive capping layer, thereby forming a plurality of first conductive bumps for each substrate; and stacking the plurality of substrates.

18. The method of claim 17, wherein the stacking comprises electrically connecting the plurality of first conductive bumps of at least one of the substrates to respective first surfaces of the plurality of through electrodes of a second of the substrates.

19. The method of claim 17, further comprising forming an underfill layer between the substrates.

20. The method of claim 17, further comprising:

forming a plurality of second conductive bumps having a diameter greater than that of the first conductive bumps on a lower part of the capping layer of a lowermost substrate of the substrate stack; and electrically connecting the plurality of second conductive bumps to a package substrate.

* * * * *